United States Patent [19]
Selle et al.

[11] Patent Number: 4,889,824
[45] Date of Patent: Dec. 26, 1989

[54] METHOD OF MANUFACTURE SEMICONDUCTOR DEVICE OF THE HETERO-JUNCTION BIPOLAR TRANSISTOR TYPE

[75] Inventors: Daniel Selle, Brundy; Philippe Boissenot, Paris; Patrick Rabinzohn, Saint-Maurice, all of France

[73] Assignee: U.S. Philips Corp., New York, N.Y.

[21] Appl. No.: 290,929

[22] Filed: Dec. 28, 1988

[30] Foreign Application Priority Data

Dec. 30, 1987 [FR] France ............................ 87 18391

[51] Int. Cl.⁴ ................... H01L 29/72; H01L 21/28
[52] U.S. Cl. ................................. 437/31; 437/32; 437/944; 437/917; 357/35; 357/71; 148/DIG. 100; 148/DIG. 10
[58] Field of Search ............... 437/31, 32, 33, 909, 437/917, 187, 26, 944; 357/34, 35, 23.4, 16, 43, 71; 148/DIG. 10, DIG. 11, DIG. 72, DIG. 100

[56] References Cited

U.S. PATENT DOCUMENTS

| | | | |
|---|---|---|---|
| 3,627,647 | 12/1971 | Reuter ................................ | 437/909 |
| 4,032,957 | 6/1977 | Yagi et al. ........................... | 357/34 |
| 4,130,826 | 12/1978 | Bachle et al. ...................... | 357/34 |
| 4,818,712 | 4/1989 | Tully .................................... | 357/35 |

FOREIGN PATENT DOCUMENTS

| | | | |
|---|---|---|---|
| 0057039 | 5/1981 | Japan ................................. | 437/944 |
| 0066430 | 4/1985 | Japan ......................... | 148/DIG. 100 |
| 0049438 | 3/1986 | Japan ................................. | 437/944 |

OTHER PUBLICATIONS

IBM Technical Disclosure Bulletin, vol. 27, No. 7B, Dec. 1984, pp. 4432-4433.

Primary Examiner—Brian E. Hearn
Assistant Examiner—Tuan Nguyen
Attorney, Agent, or Firm—Steven R. Biren

[57] ABSTRACT

A method of manufacturing a hetero-junction bipolar transistor, especially of gallium arsenide, comprising the step of forming superimposed epitaxial layers for forming a collector layer (1) of the n+ type, an emitter layer (3) of the n-type, the formation of localized implantations of the p+ type to obtain the base regions (31,30) or of the n+ type to obtain collector contact islands (20). This method also includes the formation by a controlled etching into a germanium layer (50) formed at the surface of these layers, of pads having a profile such that their tips define with a very high precision openings ($E_1$), of which the distance ($E_0$) between the edges defines the emitter contact region, while their edges have a concavity turned towards the exterior of the device.

Application integrated circuits on gallium arsenide.

14 Claims, 7 Drawing Sheets

METHOD OF MANUFACTURE SEMICONDUCTOR DEVICE OF THE HETERO-JUNCTION BIPOLAR TRANSISTOR TYPE

BACKGROUND OF THE INVENTION

The invention relates to a method manufacturing a semiconductor device of the hetero-junction bipolar transistor type having a planar structure, this method comprising at least the step of manufacturing a structure comprising successively at least one collector layer of a binary material of a first conductivity type, a base layer of a binary material of the second conductivity type opposite to the first type, an emitter layer of a ternary material of the first conductivity type and a binary highly doped contact layer of the first conductivity type.

The invention is used in the manufacture of integrated circuits on materials of the III-V group and especially on gallium arsenide including hetero-junction bipolar transistors.

A hetero-junction bipolar transistor having a planar structure is already known from the publication entitled "A Fully Planar Hetero-junction Bipolar Transistor" by John W. Tully et alii in "I.E.E.E. Electron Device Letters", Vol. EDL 7, No. 11, November 1986, pp. 615-617.

This document describes a transistor formed on a semiconductor substrate of the n+ conductivity type. This transistor comprises a first layer of GaAs of the n+ type, a second layer of GaAs of the n-type and a base layer of the p+ type formed by localized implantation in the upper part of the layer of n-type GaAs.

This transistor further comprises two upper layers, the first layer of GaALAs of the n-type to form the emitter and the second layer of GaAs of the n+ type to permit the connection of the contacts. The base regions are constituted by p+ islands connecting the base contacts to an implanted p+ layer.

The method of manufacturing this transistor begins with the epitaxial growth of the n+ and n collector layers by the so-called MOCVD method. The base region is defined by a photoresist mask and is implanted selectively by means of Zn+ ions. After elimination of the photoresist layer, the substrate is reinserted into the MOCVD reactor for an annealing treatment at high temperature. This operation is immediately followed by the growth of the n-type emitter layer of GaAlAs and the n+ type contact layer of GaAs. The emitter layer having the composition $Ga_{1-x}Al_xAs$ has a gradient of the concentration x of Al. In the first 50 nm, the concentration x lies between 0 and 0.30. Subsequently, the remaining part of the emitter layer is formed with x=0.30 of Al. Subsequently, the device is covered by $SiO_2$ and then by a layer of Al having each a thickness of 400 nm. The base contacts are defined by photolithography and the aluminum is chemically etched, whereupon the layer of $SiO_2$ is etched by plasma. This method results in a stronger etching of $SiO_2$ than that of Al, as a result of which a projection is obtained above $SiO_2$. This method later serves for the "lift-off" of the aluminum. The upper layer of GaAs is thus uncovered and Zn+ ions are implanted in the openings of $Al/SiO_2$. Subsequently, a metal apt to form a p-type contact, such as Mo/Cr, is evaporated. At this stage of the method, the aluminum is eliminated chemically, which permits of eliminating the excess of Mo/Cr. After the "lift-off", the sample is annealed at high temperature to activate the p+ implantation. Finally, the emitter and collector contacts defined by photolithography are formed simultaneously by means of metallization of AuGe/Ni/Au the excess metal is eliminated and its contacts are annealed.

In this known method, the emitter and collector metallizations are "simply aligned" with respect to the base metallization. This type of alignment leads to a precision of hardly more than 1 $\mu$m. This results in that the distances between the emitter and base metallizations and the distances between the collector and base metallizations are at least equal to 1 $\mu$m. In these conditions, the transistors have dimensions too large to be compatible with the performances required for the envisaged application.

SUMMARY OF THE INVENTION

On the contrary, the present invention proposes a method of manufacturing which permits of obtaining a "self-alignment" of the emitter and collector contacts with respect to the base contacts, from which result the possibility of forming:

an emitter of submicron dimensions, distances between electrodes which are extremely small and have extremely precise dimensions.

These advantages are due to the fact that the method according to the invention utilizes for the definition of the base regions an extremely precise etching process, which permits of auto-aligning all the electrodes with respect to the base contacts while being based on this fundamental operation constituted by this controlled etching process.

This results in that the transistors obtained according to the invention:

are extremely compact and hence have very small dimensions and permit an integration at high density;

show very repetitive dimensions from one transistor to the other and hence a very small dispersion of their characteristics.

This object is achieved by means of a method of the kind described above and moreover comprising the steps of:

a. depositing a layer of germanium ($G_e$) and then depositing a layer of silica ($SiO_2$);

b. positioning a mask $MK_2$ defining openings normal to the base contact regions and etching the silica layer through said openings until the surface of the germanium layer is exposed by a method which permits of obtaining etching edges perpendicular to the plane of the layer, thus forming openings in the silica layer;

c. etching the germanium layer through the openings of the silica layer by a method which permits of controlling on the etching edges of this germanium layer both the etching rate parallel to the plane of the layers and the etching rate perpendicularly to the plane of the layers in such a manner that the feet of these etching edges define openings having a dimension at least equal to the dimension of the openings of the silica layer and that the tips of these etching edges define with a very high precision openings such that the distance in the germanium between the edge of an opening and the edge of the next opening defines the emitter region and in such a manner that these etching edges have a concavity turned towards the exterior of the device;

d. localllized implantation of ions of the second conductivity type through the openings and with an energy sufficient to attain the base layer in order to form islands of the second conductivity type connecting the base layer to the surface of the last contact layer;

e. depositing a metallic layer suitable to form the base contacts and then etching selectively the silica layer leaving intact the pads of the germanium layer;

f. forming a fresh layer of silica ($SiO_2$) having a very large thickness, planarizing the device at the upper level of the germanium layer and then selectively etching the bond pads of the germanium layer by a method which permits of maintaining with a high precision in negative form the profile of the etching edges defined during the step (c) along the pads of the fresh silica layer remaining at the area of the openings defined during the step (b), these silica pads defining by their upper part openings having a dimension equal to the distance in the germanium between the edge of an opening and the edge of the next opening defined during the step (c);

g. depositing a metallic layer suitable to form the emitter and collector contacts, the pads of the fresh silica layer serving as a mask, and then eliminating the pads of the fresh silica layer;

h. localized ion implantation between the collector, base and emitter contacts serving as a mask of species suitable to form insulating islands between these electrodes and with an energy which permits of attaining the upper surface of the emitter layer of the first conductivity type.

BRIEF DESCRIPTION OF THE DRAWING

The invention will be understood more clearly by means of the following description illustrated by the enclosed Figures, of which.

DESCRIPTION OF THE PREFERRED EMBODIMENTS

Figure 1A:
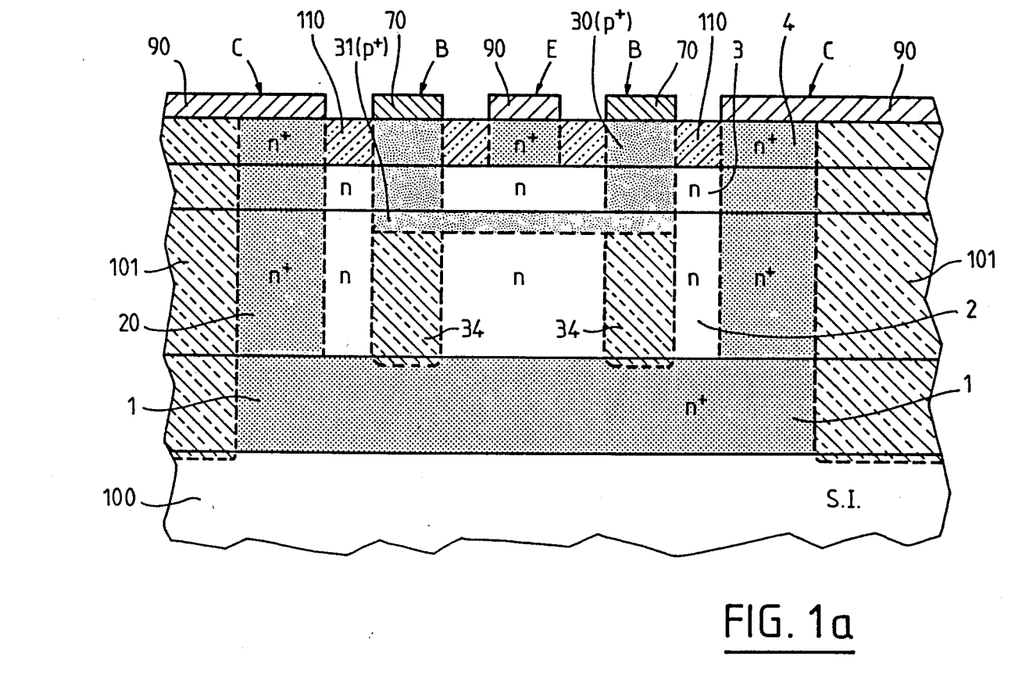
FIG. 1a shows in diagrammatic sectional view the planar hetero-junction bipolar transistor obtained by the method according to the invention.

As shown in FIG. 1a, the device according to the invention first comprises a layer 1 of gallium arsenide (GaAs) of the n+ conductivity type formed on a semi-insulating substrate 100 of a material of the group III-V.

This transistor further comprises a layer 2 of gallium arsenide (GaAs) of the n-conductivity type.

This transistor moreover comprises a layer 3 of gallium aluminum arsenide (GaAlAs) of the n-conductivity type, i.e. the emitter layer.

At the surface of the layer 3, an epitaxial layer of gallium arsenide (GaAs) of the n+ conductivity type is present to permit the connection of the collector and emitter contacts. This layer 4 of the n+ type is connected to the collector layer 1 of the n+ type by n+ type islands 20 arranged under the collector contacts $C_1$.

At the surface of the layer 4 the metallic collector base and emitter contacts C, B and E, respectively, are formed.

Islands 40 of the p+ conductivity type connected by a layer 31 formed at the level of the surface of the layer 2 also of the p+ conductivity type are provided in the layers 3 and 4 under the base contacts B.

The base contact is formed by means of metals, such as AuMn or AuBe. The emitter and collector contacts are formed by means of metals, such as: AuGe/Ni.

The insulation between the different electrodes is obtained by means of islands 110.

This transistor has the advantage of being absolutely planar.

Figure 1B:
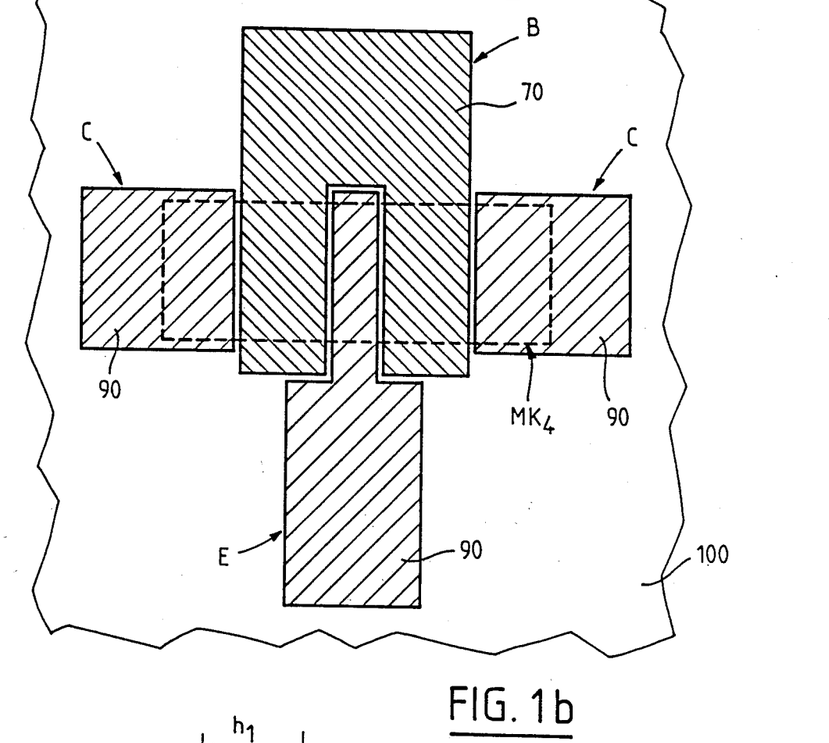
FIG. 1b shows this transistor in plan view.

FIG. 1b moreover shows in plan view an interdigitated structure having two base fingers B and one emitter finger E. If further shows a collector contact C.

Figure 2A:
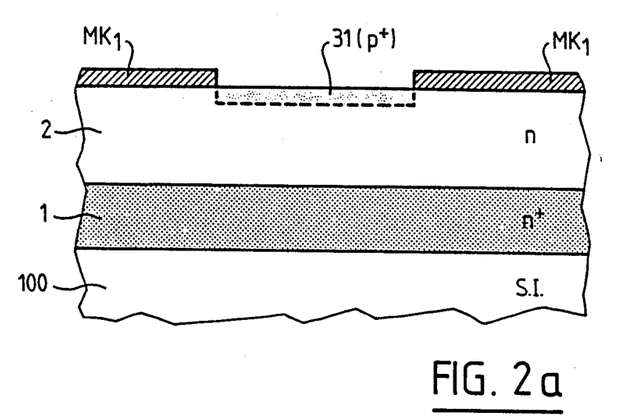
FIGS. 2a to 2i illustrate the different steps of the manufacturing method according to the invention.
Figure 2B:
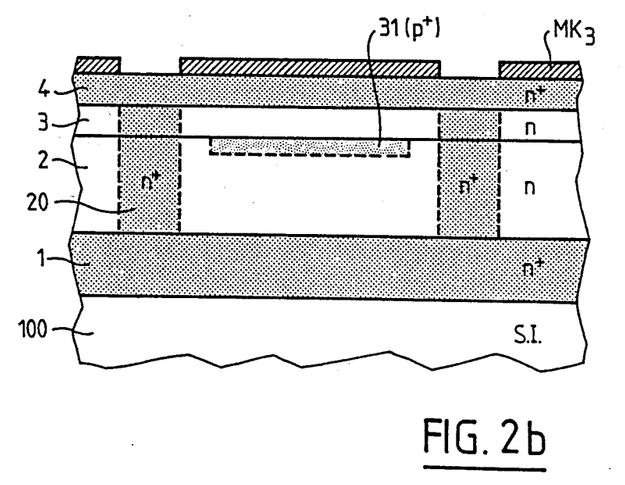
Figure 2C:
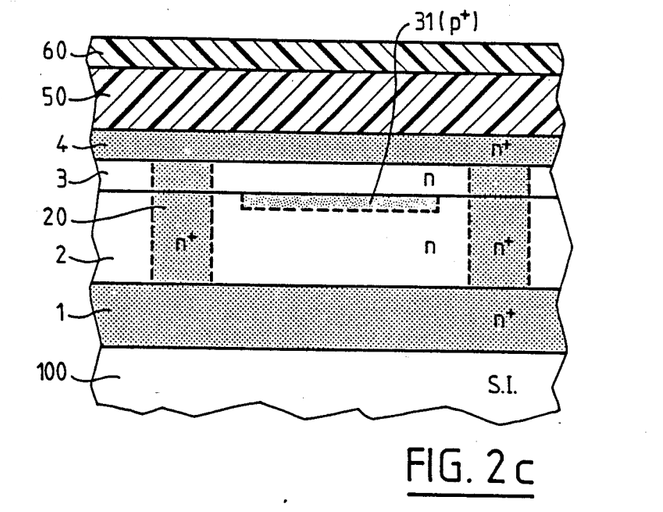
Figure 2D:
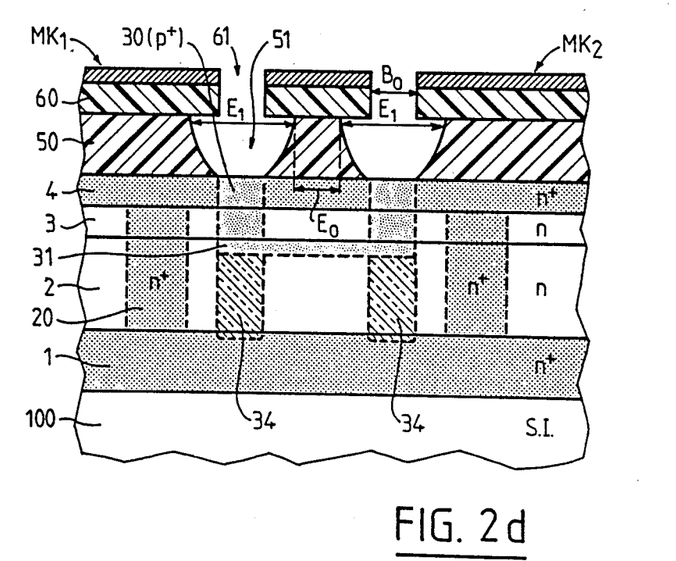

The method of manufacturing described below shows how to obtain such a transistor, whose emitter and collector contacts are self-aligned with respect to the base contacts, which permits of obtaining extremely small, precise and repetitive transverse dimensions and hence transistors which have very small dimensions and whose performances are improved. This results in that the integration density can be increased and that the performances of the circuits are also improved. The manufacturing method according to the invention comprises at least the following steps:

a. Forming a substrate 100 of a material of the group III-V, which is monocrystalline and has an upper surface orientated, for example, in a crystallographic direction (100). This substrate is chosen to be semi-insulating in order that the method is in synergy as to manufacture with the methods of manufacturing integrated circuits. In fact, the object aimed at by the invention is to provide integrated hetero-junction transistors and not to provide discrete transistors. The substrate will favourably consist of semi-insulating gallium arsenide (GaAs) obtained, for example, by doping by means of iron (Fe) ions. This substrate can also be formed from indium-doped and annealed gallium arsenide, which permits of obtaining materials devoid of dislocations and compatible with the subsequent growth of epitaxial layers of the group III-V.

b. Forming two flat epitaxial layers of gallium arsenide to obtain the collector, i.e. successively a layer 1 of the n+ conductivity type and a layer 2 of the n -conductivity type. The epitaxial growth of these layers can take place from the vapour phase or from the liquid phase. It will be preferably formed by a metal-organic (MOCVD) or MBE method. The layer 1 will have a thickness of 0.2 to 1 $\mu$m and preferably of 0.5 $\mu$m. This layer 1 is of the n+ conductivity type obtained, for example, by a doping by means of silicon (Si) ions at about 3 to $5.10^{18}$ ions/$cm^3$ (cf. FIG. 2a). The optimum thickness of the layer 2 is 0.3 $\mu$m and the n-conductivity type is obtained, for example, by doping by means of silicon (Si) ions at $5.10^{16}$ ions/$cm^3$.

c. localized implantation into the superficial region of the second collector layer 2 of charge carriers of the p-type to form a base layer 31 of the p+ conductivity type (cf. FIG. 2a). For this purpose, a mask $MK_1$, for example of photoresist, is formed at the surface of the layer 2 and an opening is provided in the mask at the surface of the region intended to constitute the base region. The layer 31 is formed by shallow (100 nm and less) implantation of ions, such as Be, Mg or Zn. It is also possible to carry out a co-implantation of phosphor (P) with Be or of fluorine (F) with Mg, which permits of improving the percentage of activation and of reducing the diffusion during later thermal treatments. The concentration of the implanted ions will be about $5.10^{18}$ $cm^{-3}$;

d. Forming two epitaxial flat superimposed layers, i.e. the first layer 3 of a ternary material of the group III–V, for example gallium aluminum arsenide (GaAlAs) of the n-conductivity type forming the emitter layer and the layer 4 of a binary or ternary material, for example GaAs or GaInAs of the n+ conductivity type to permit the connection of the contacts. The epitaxial growth of these layers will be effected by the same method chosen for the growth of the layers 1 and 2 (cf. FIG. 2b). The emitter layer 3 will have a thickness of the order of 0.15 $\mu$m and the contact layer 4 will have a thickness of the order of 0.15 $\mu$m. The emitter layer 3 will be doped by means of ions of, for example, Si at a concentration of the order of $5.10^{17}/cm^3$ and the contact layer 4 will be doped by means of Si ions at a concentration of $2.10^{18}$ $cm^3$. The layer 3 of gallium aluminum arsenide (GaAlAs) will preferably have a concentration of 0.25 of Al.

e. localized implantation into a region chosen for forming the collector of n-type charge carriers at a depth suitable to obtain n+ type islands 20 connecting the n+ type collector layer 1 of gallium arsenide to the n+ type layer 4 of gallium arsenide. This implantation will be effected in the opening of a mask $MK_3$ by means of ions of, for example, Si at a concentration of the order of $5.10^{18}/cm^3$. At the end of this implantation, the mask $MK_3$ will be eliminated (cf. FIG. 2b). In order to obtain the flat profile at $5.10^{18}$ desired, there will be proceeded by means of decreasing energies.

f. Depositing a layer 50 of germanium (Ge) and then depositing a layer 60 of silica ($SiO_2$). These deposition steps are effected by chemical deposition from the vapour phase assisted by plasma (PECVD). The germanium layer favorably has a thickness of 0.4 $\mu$m and the layer of silica then has a thickness of 0.6 $\mu$m (cf. FIG. 2c).

g. Positioning a mask $MK_2$ of, for example, photoresist defining openings 61 normal to the base regions and etching the silica layer 60 through these openings 61 until the surface of the germanium layer 50 is exposed. This etching step is carried out by a method permitting of obtaining etching edges perpendicular to the plane of the layer, for example by reactive ion etching (RIE) by means of $CHF_3$-$SF_6$ gases (in the ratio of 30 to 1). Thus, openings are formed in the layer 60 (cf. FIG. 2d), which openings have the dimension $B_0$ in the plane of FIG. 2d and define the base regions to be formed.

h. Etching the germanium layer 50 through the openings $B_0$ of the silica layer by a method permitting of controlling on the etching edges of this germanium layer both the etching rate parallel to the plane of the layers and the etching rate perpendicular to the plane of the layers so as to obtain that the feet of these etching edges define openings having a dimension at least equal to $B_0$ and that the tips of these edges define with a very high precision openings $E_1$ such that the distance $E_0$ in the germanium between the edge of an opening $E_{1q}$ and the edge of the next opening $E_1$ defines the emitter region (cf. FIG. 3). The formation of this profile must be controlled very accurately because it will permit in a single operation of defining both the base contacts and the emitter contact according to a so-called self-aligned technology.

Figure 3:
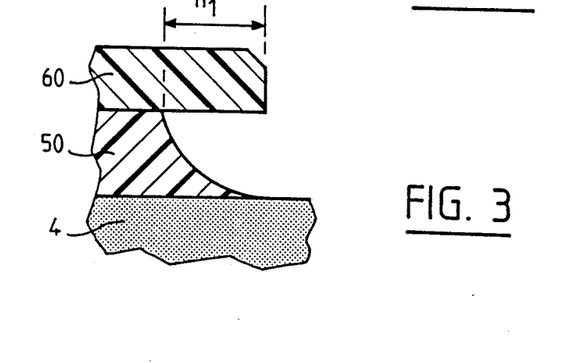
FIG. 3 shows the etching profile of the germanium layer under the silica layer during the definition of the base and emitter zones by the method according to the invention.

As shown in FIG. 3, an etching of the germanium appears under the silica layer, which is slightly concave, the concavity being turned towards the exterior of the device. The etching rate parallel to the plane of the substrate must be of the order of:

160 nm per mn and the etching rate perpendicularly to the plane of the substrate must be 325 nm per nm.

This is obtained by reactive ion etching (RIE) by means of a mixture of gases of $SF_6$ with 12.5 SCCM, $O_2$ with 4 SCCM and $N_2$ with 13.5 SCCM at a pressure and a power of 30 Mtorr and 60 W, respectively. In these conditions, the etching parallel to the plane of the layers is half that perpendicularly to the plane of the layers; the dimension of the etching of the germanium under the silica layer is $h_1$.

i. localized implantation of p+ type charge carriers through the openings $B_0$ with an energy sufficient to attain the base layer 31 to form p+ type islands 30 connecting the base layer 31 to the surface of the n+ type epitaxial layer 4. This implantation is effected in the same manner as during the step (c) by means of Mg, Be or Zn ions or by the aforementioned co-implantation. A flat implantation profile is obtained by means of decreasing intensities until a concentration of a few $10^{19}$ $cm^{-3}$ is obtained.

Figure 2E:
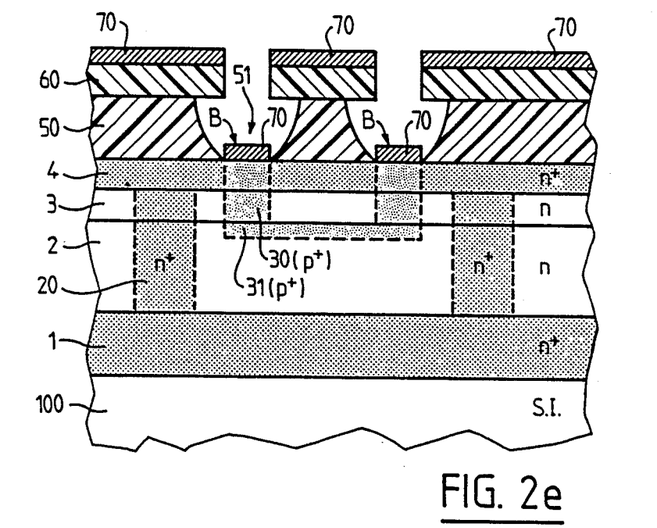
Figure 2F:
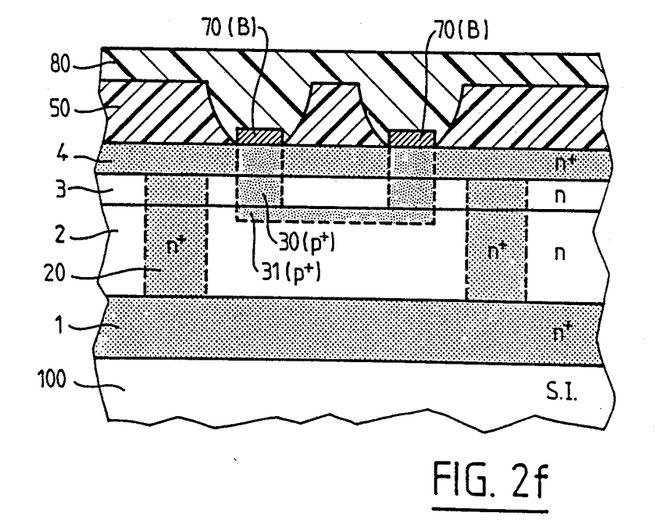

The implantation annealing treatment can be effected at 850° C. for a few minutes to 10 minutes at arsine ($AsH_3$) pressure. However, preferably the annealing will be of the "FLASH" type to minimize the diffusion phenomena and to improve the activation consisting in that the device is brought to 900° C. for, for example, 3 seconds (cf. FIG. 2d).

j. Depositing in the openings $B_0$ a metallic layer 70 suitable to form the base contacts B and then selectively etching the silica layer 60 leaving in tact the bond pads of the germanium layer 50 (cf. FIG. 2e). The metallic layer 70 can favourably be composed of gold-manganese (Au-Mn), of gold-beryllium (Au-Be) or of gold-zinc (Au-Zn), preferably Au-Mn at 4%, which permits of obtaining a contact of low resistivity. This layer is deposited not only in the openings $B_0$, but also at the surface of the silica 60. The subsequent step of etching the silica layer 60 will permit of eliminating by "LIFT-OFF" the undesirable parts of the layer 70. The step of etching the silica layer 60 will be effected by means of a buffered solution of hydrofluoric acid (HF) in order to permit of elliminating the silica layer 60 without damaging the base contacts B formed in the openings $B_0$.

k. Forming a fresh layer 80 of silica (cf. FIG. 2f) and then planarizing the device at the upper level of the germanium layer (cf. FIG. 2g) and subsequently selectively etching the bond pads of the germanium layer 50 by a method which permits of maintaining with a high precision in negative form the profile of the etching edges defined during the step (h) along the bond pads of the fresh silica layer 80 remaining at the area of the openings 51 (cf. FIG. 2h).

The tips of these pads 80, which have the dimensions of the former openings $E_1$, define especially openings $E_0$ defining the emitter contact to be formed. The tips of these pads 80, which are normal to the layer 4, will also permit of defining the collector contacts by self-alignment, this normal position defining the distance between the electrodes.

Figure 2G:
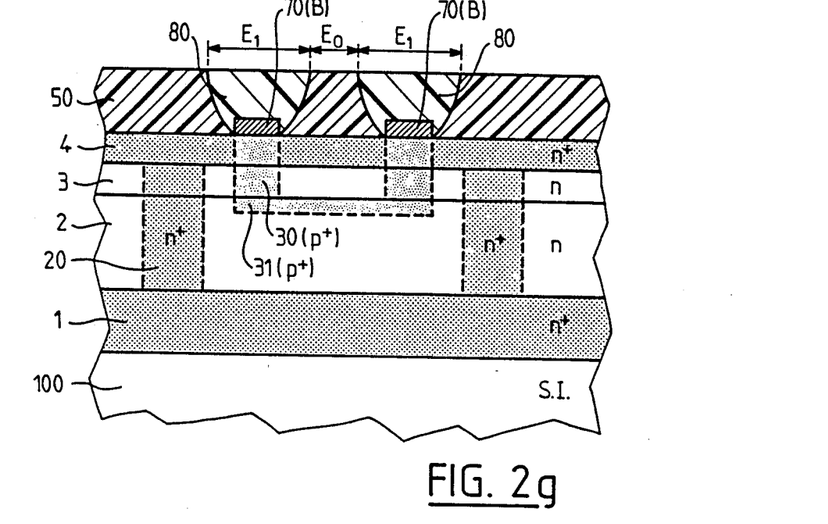

During the formation of the fresh thick layer 80 of silica ($SiO_2$), the openings 51 are filled with silica. Subsequently, the method of planarization is carried out. About the use of such a method it is recommendable to read the publication: "1984 5-MIC Conference June 21-22" 1984 I.E.E.E. entitled: "Plasma Planarization with a non-planar sacrificial layer" by J. E. Gimpelson et alii, p. 37–44, or further "Journal Electrochemical Society Solid State Science and Technology" January 1986, the article entitled: "Two-layer planarization process" by A. Shilz et alii, p. 178–181. Here the planarization can be carried out by RIE etching by means of CHF$_3$-O$_2$ gases with 30 SCCM for CHF$_3$ and 3 SCCM for O$_2$. At the end of this process, the device shown in FIG. 2g is left, in which the silica 80 fills the openings 51 and is at the same upper level of the germanium layer 50. The silica pads 80 then have the same profile in negative form as the germanium pads 50 obtained during the step (h). As already stated, this profile must be maintained during the step of etching the germanium 50. Therefore, this etching step will be effected, for example, by reactive ion etching (RIE) carried out by means of SF$_6$-N$_2$ gases (50%-50%).

l. Depositing a metallic layer 90 suitable to form the emitter contacts E and the collector contacts C, the pads of the fresh silica layer 80 serving as a mask, and then eliminating the pads of the fresh silica layer 80.

Figure 2H:
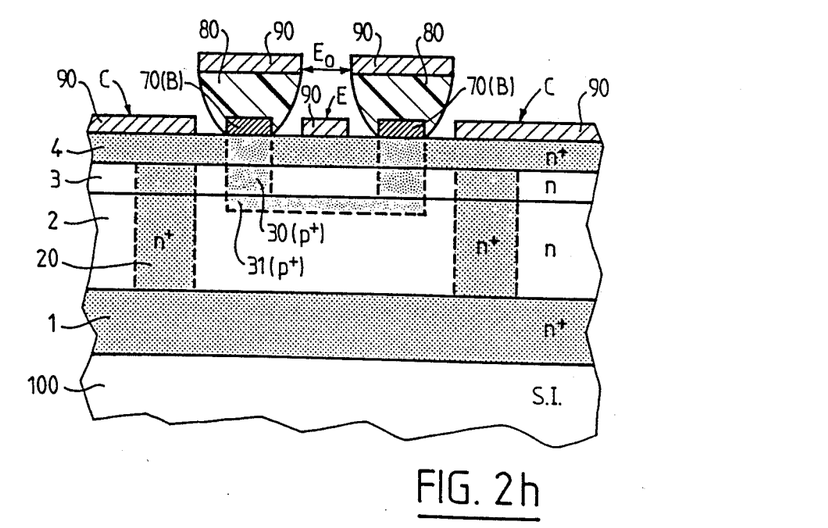

The metal for constituting the emitter and collector contact layer 90 will advantageously be a multi-layer of the alloy Au-Ge and a nickel layer on it (cf. FIG. 2h). The contacts are subjected to an annealing treatment at about 400° C.

During the deposition, the metallic layer 90 has also covered the silica pads 80; this undesirable part of the layer 90 will be eliminated by "LIFT-OFF" during the elimination of the silica by means of, for example, a buffered solution of HF.

Figure 2I:
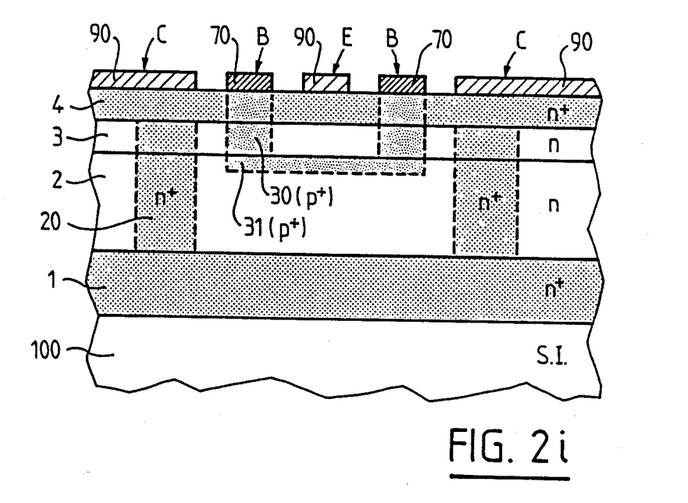

The device of the hetero-junction transistor type having the required planar form is then obtained (cf. FIG. 2i). Moreover, this device has been obtained by the self-alignment of the collector-emitter contacts with respect to the base contact in a single operation consisting in that the profile of the etching edges of the germanium layer 50 is obtained and then this profile is maintained negative form on the silica pads 80.

m. localized ion implantation between the collector, base and emitter contacts C, B and E, respectively, serving as a mask of species suitable to form insulating islands 110 between these electrodes to avoid the leakage currents at an energy permitting of attaining the upper surface of the n-type emitter layer 3. For this purpose, boron (B) ions, oxygen (O) ions or protons can be implanted at a concentration of about $2.10^{18}$ cm$^{-3}$.

Thus, the device according to the invention has different advantages: First the use of a semi-insulating substrate of gallium arsenide permits of being in synergy as to manufacture with other device, such as field effect transistors, diodes, etc . . . ; the use of the Si substrate permits of eliminating the parasitic capacitances of the bond pads.

In a variation of the invention, the semi-insulating substrate consists of gallium indium arsenide, which is obtained directly so as to be semi-insulating by annealing and is particularly devoid of dislocations, as is known from European Patent Application Ep-A-0176130.

On the other hand, in this variation, the collector layer 1 can be formed by ion implantation, for example of selenium (Se), directly into the semi-insulating substrate 100.

It should be noted that the fact that the emitter fingers are made very narrow permits of improving the performances of the device. In fact, the equivalent circuit diagram of the transistor (HBT) shows a resistor in series with the base and a base-collector capacitance.

The freqeuncy response of the transistor is determined by the product of the base resistance and the base-collector capacitance. The reduction of the dimensions of the transistor permits of reducing the product of these two factors, and consequently of increasing the frequency response of the transistor. This results in that the latter then has performances really and markedly improved with respect to the known prior art device.

The method according to the invention can moreover comprise an insulation step for defining the transistor. For this purpose, a step (d') can be interposed between the step (d) and the step (e).

d'. Implantation of ions, favorably O$^+$ ions, in the openings of a mask MK$_4$ which covers the active zone of the transistor except the periphery (cf. FIG. 4). The ions are implanted into the peripheral insulation zones 101 of the transistor.

It is known already from the prior art to implant boron (B) ions to obtain the insulation of the active zones. This type of boron implantation leads to defects and permits of insulating, for example, n- and p-type layers, which is necessary when the base layer is obtained by epitaxy on the whole surface of the device and is not localized as here, according to the invention, to a perfectly defined layer 31.

Here, the insulation by means of oxygen is preferred to the boron insulation due to the face that, if the latter was chosen, its efficaciousness would disappear during annealing treatments at temperatures higher than 500°-600° C. Now, such annealing treatments at temperatures higher than 600° C. are used subsequently in the present method.

Thus, the boron insulation being not necessary because the base layer is defined by a method other than insulation after epitaxy, the oxygen insulation on the contrary is favorable.

Figure 4:
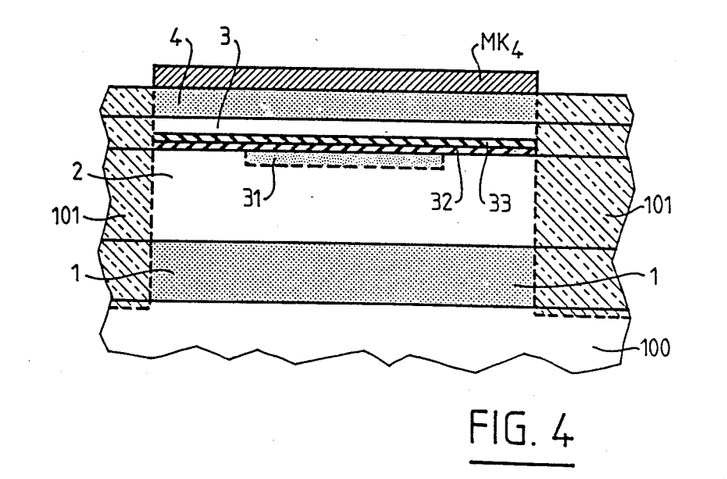
FIG. 4 illustrates steps forming a variation of the method.

The method according to the invention can moreover comprise the step of forming a layer intended to avoid the diffusion of p-type charge carries from the base layer 31 to the emitter layer 3. For this purpose, this method then comprises between the step (c) and the step (d) a step (c), such as:

c. forming an epitaxial layer 32 at the surface of the layer 2 of intentionally undoped or weakly p-doped GaAs of the order of 10 to 20 nm to avoid the diffusion of p-type charge carriers from the layer 31 to the layer 3 (cf. FIG. 4).

The method according to the invention can also comprise a step (c) between the step (c) and the step (d), such as:

c. forming an epitaxial layer 33 of GaAlAs having a composition gradient of Al of from 0 to 25% so as to obtain a gradual hetero-junction between the emitter and the base, which permits of obtaining a higher current amplification (cf. FIG. 4).

The method according to the invention can also comprise between the step (h) and the step (i) a step (h), such as:

h. implantation through the openings B$_0$ of oxygen ions to produce insulation zones 34 under the extrinsic base zones and thus to reduce the base-collector capacitance, then permitting of improving the frequency responds of the transistor. The favourable concentration of implanted oxygen will be of $5.10^{16}$ cm$^{-3}$ to $5.10^{18}$ cm$^{-3}$. The implantation depth will be in the zone between the layer 31 and the layer 1 (cf. FIG. 2d).

FIG. 1b shows in plan view an embodiment of the device. The broken line indicates the edges of the mask MK$_4$ which covered the active zone during the step (d) and which therefore defines this active zone.

Other embodiments of the transistor and especially numerous other configurations of the electrodes are possible without departing from the scope of the present invention.

Finally, instead of providing the insulation of the active zone during the step (d'), this insulation can be obtained during an ultimate step (m') of implanting protons or boron around a mask covering the active zone of the transistor.

Preferential values for the different dimensions used in the method according to the invention are given below:

$B_0 = 1$ to $2$ $\mu m$
$E_1 = 0.9$ to $1.6$ $\mu m$
$h_1 = 0.2$ to $0.3$ $\mu m$
$E_0 = 0.5$ to $1$ $\mu m$.

In a variation of the invention, the base layer can also be obtained by replacing the step (c) known from the prior art by a step ($c_0$), such as:

$c_0$. forming an epitaxial layer 31' of a binary material of the group III-V of p+ conductivity type to form a base layer and then etching around a mask defining the base zone down to the upper level of the collector layer 2. The etching step can be a dry etching step or a wet etching step. The base zone 31' is then present in relief on the collector layer 2. The method is further carried out in the manner described above. The thickness of the p+ layer 31' is of the order of 0.1 $\mu m$. The device obtained is therefore quasi-planar.

Other III-V materials may be envisaged to obtain the transistor provided that the conditions necessary to obtain hetero-junctions are taken into account.

We claim:

1. A method of manufacturing a semiconductor device of the hetero-junction bipolar transistor type having a planar structure, said method comprising at least the step of manufacturing a structure comprising successively at least one collector layer of a binary material of a first conductivity type, a base layer of a binary material of the second conductivity type opposite to the first type, an emitter layer of a ternary material of the first conductivity type and a binary highly doped contact layer of the first conductivity type, characterized in that it moreover comprises the steps of:

a. depositing a layer of germanium (Ge) and then depositing a layer of silica ($SiO_2$);
   b. positioning a mask $MK_2$ defining openings normal to the base contact regions and etching the silica layer through said openings until the surface of the germanium layer is exposed by a method which permits of obtaining etching edges perpendicular to the plane of the layers, thus forming openings in the silica layer;
   c. etching the germanium layer through the openings of the silica layer by a method which permits of controlling on the etching edges of this germanium layer both the etching rate parallel to the plane of the layers and the etching rate perpendicularly to the plane of the layers in such a manner that the feet of these etching edges define openings having a dimension at least equal to the dimension of the openings of the silica layer and that the tips of these etching edges define with a very high precision openings such that the distance in the germanium between the edge of an opening and the edge of the next opening defines the emitter region and in such a manner that these etching edges have a concavity turned towards the exterior of the device;
   d. localized implanting of ions of the second conductivity type through the openings and with an energy sufficient to attain the base layer in order to form islands of the second conductivity type connecting the base layer to the surface of the contact layer;
   e. depositing a metallic layer suitable to form the base contacts and then etching selectively the silica layer leaving in tact the pads of the germanium layer;
   f. forming a fresh layer of silica ($SiO_2$) having a very large thickness, planarizing the device at the upper level of the germanium layer and then selectively etching the bond pads of the germanium layer by a method which permits of maintaining with a high precision in negative form the profile of the etching edges defined during the step (c) along the pads of the fresh silica layer remaining at the area of the openings defined during the step (b), these silica pads defining by their upper part openings having a dimension equal to the distance in the germanium between the edge of an opening and the edge of the next opening defined during the step (c);
   g. depositing a metallic layer suitable to form the emitter and collector contacts, the pads of the fresh silica layer serving as a mask, and then eliminating the pads of the fresh silica layer; and
   h. localized ion implanting between the collector, base and emitter contacts serving as a mask of species suitable to form insulating islands between these electrodes and with an energy which permits of attaining the upper surface of the emitter layer of the first conductivity type.

2. A method as claimed in claim 1, characterized in that the structure of the collector, base and emitter layers is formed on a semi-insulating substrate, and in that in this structure:
   the collector is constituted by the superposition of two binary layers of the first conductivity type, the first of which is highly doped,
   the base layer is formed by a localized implantation of ions of the second conductivity type into the superficial region of the second collector layer,
   islands connecting the first collector layer to the contact layer are formed by a localized implantation into a region chosen to form the collector of ions of the first conductivity type.

3. A method as claimed in claim 1 or 2, characterized in that the transistor is insulated by an implantation of ions suitable to form insulation regions defining the active zone of the transistor, the latter zone being masked during this operation.

4. A method as claimed in claim 1 or 2, characterized in that a binary not intentionally doped layer is formed between the binary base layer and the ternary emitter layer to avoid the diffusion of charge carriers from the binary base layer to the ternary emitter layer.

5. A method as claimed in claim 4, characterized in that a ternary layer having a composition gradient is formed between the not intentionally doped binary layer and the ternary emitter layer to obtain a gradual hetero-junction between the emitter and the base.

6. A method as claimed in claim 1 or 2, characterized in that it comprises between the steps (c) and the step (d) a step (c'):
   c'. implanting in the openings ions suitable to form insulation zones under the base regions.

7. A method as claimed in claim 2, characterized in that:
- the substrate consists of semi-insulating gallium arsenide (GaAs) orientated in a crystallographic direction;
- the binary layers consist of gallium arsenide (GaAs);
- the ternary layers consist of gallium aluminum arsenide (GaAlAs) having, a composition gradient of the element Al when this gradient is provided;
- the first conductivity type is the n-type;
- the second opposite conductivity type is the p-type.

8. A method as claimed in claim 7, characterized in that, in order to obtain the n+ or n conductivity type, the layers are doped by means of Si+ ions.

9. A method as claimed in claim 7 or 8, characterized in that, in order to obtain islands of the n+ conductivity type, the ion implantation provided is effected by means of Si+ ions.

10. A method as claimed in claim 1 or 2, characterized in that, in order to obtain zones of the p+ conductivity type, the ion implantation provided is effected by means of ions chosen among Be, Mg and Zn and among an association of F with Be or of P with Mg.

11. A method as claimed in claim 1 or 2, characterized in that the metallic layer deposited during the step (e) for forming the base contacts is chosen among the compounds Au-Mn, Au-Be and Au-Zn, and in that the metallic layer deposited during the step (g) for forming the emitter and collector contacts is a multi-layer of Au-Ge and Ni on it.

12. A method as claimed in claim 3, characterized in that, in order to form the insulation zones, oxygen (O+) ions are implanted.

13. A method as claimed in claim 1 or 2, characterized in that, in order to form the insulation zones between the electrodes, during the step (h) ions chosen among B ions, O ions and protons are implanted.

14. A method as claimed in claim 1 or 2, characterized in that the base layer is an additional layer of a binary material of the group III-V of the second conductivity type, which is etched around a mask defining the base zone down to the upper level of the collector layer.

* * * * *